United States Patent
Rogers et al.

Patent Number: 6,091,223
Date of Patent: Jul. 18, 2000

[54] CONTACTOR MONITOR FOR CHARGING STATIONS

[75] Inventors: Michael G. Rogers, Nevada City; Jason M. France, Auburn, both of Calif.

[73] Assignee: Electric Vehicle Infrastructure, Inc., Auburn, Calif.

[21] Appl. No.: 09/373,017

[22] Filed: Aug. 11, 1999

[51] Int. Cl.[7] .......................... H01M 10/44; H01M 10/46
[52] U.S. Cl. ............................. 320/111; 320/128
[58] Field of Search ...................... 320/111, 121, 320/128, FOR 128, FOR 132, FOR 133, FOR 153

[56] References Cited

U.S. PATENT DOCUMENTS

| | | |
|---|---|---|
| 4,383,210 | 5/1983 | Wilkinson . |
| 5,202,617 | 4/1993 | Nor . |
| 5,220,268 | 6/1993 | Rose et al. . |
| 5,264,776 | 11/1993 | Hulsey . |
| 5,272,431 | 12/1993 | Nee . |
| 5,433,623 | 7/1995 | Wakata et al. . |
| 5,458,496 | 10/1995 | Itou et al. . |
| 5,462,439 | 10/1995 | Keith . |
| 5,498,948 | 3/1996 | Bruni et al. . |
| 5,536,173 | 7/1996 | Fujitani et al. . |
| 5,558,533 | 9/1996 | Hashizawa et al. . |

*Primary Examiner*—Edward H. Tso
*Attorney, Agent, or Firm*—John P. O'Banion

[57] ABSTRACT

A monitoring device for sensing the voltage drop across a contactor in an electrical circuit. Voltage drop across the contactor is sensed by providing alternate current paths from either side of the contactor through a threshold sense circuit. The alternate current paths contain non-resistive voltage dropping components such that the relative amount of conduction through each path is determined largely by the voltage drop across the contactor. A signal is provided by the threshold sense circuit according to the relative currents which represents the voltage drop across the contactor. In this way, an increased voltage drop across the contacts of the contactor can be determined before dangerous amounts of heat are dissipated in high current switching circuits.

19 Claims, 5 Drawing Sheets

CONTACTOR MONITOR FOR CHARGING STATIONS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to equipment for charging electrical power storage devices, and more particularly to an apparatus and method for monitoring the state of a contactor which connects the power charging source with the electrical power storage device load.

2. Description of the Background Art

Contactors are used for connecting or switching high current loads, such as may be found in the connection of an electric vehicle to a charging device. A large capacity electrical power storage device, such as a battery, typically requires a high current charging system so that the device may be charged within a reasonable period of time. When charging these large loads, the point of interface between the charging system and the device to be charged is called a contactor. The contactor provides a conduction path via "contacts" between the charger and the battery through which charging current flows. If the contactor becomes dirty, or contaminated, the resistance of the conduction path increases. At high currents, such as used when charging the power storage device in an electric vehicle, even small increases in resistance in the contactor can dissipate large amounts of energy and, in so doing, generate huge amounts of heat. The heat that is generated can be localized, wherein pitting, corrosion, or other damage to the contactor may occur thereby rendering it inoperative or unsafe. Therefore, when charging large capacity electrical power storage devices it is desirable to monitor the state of the contactor.

BRIEF SUMMARY OF THE INVENTION

The contactor monitor for charging stations in accordance with the present invention satisfies the need for a reliable and inexpensive device for monitoring the conductive state of a contactor through which charging current passes from a charger to an electrical storage device.

Every contactor exhibits an electrical resistance to the flow of charging current which can be measured as a voltage drop across the contactor. For example, a contactor with a nominal resistance of 0.005 ohms passing 100 Amperes of current exhibits a voltage drop of (0.005×100)=0.5 volts, and a contactor power dissipation of ($100^2$×0.005)=50 watts. Contamination, corrosion, pitting or other defects within the contactor will raise its electrical resistance, thereby increasing charging losses which can lead to the production of damaging levels of localized heat dissipation within the contactor. The present invention employs an economical method for monitoring the voltage drop across a contactor. Information from the monitor may be used to control a charging system, set off an alarm, or signal additional equipment.

By way of example, and not of limitation, the monitoring device of the present invention comprises an input sensor connected to the power input side of the contactor, a load sensor tied to the load side of the contactor, and a sense threshold circuit in connection with one or both of the sensors. One or more voltage controlled current switches comprise the input and load sensors. A diode is an example of a voltage controlled current switch, wherein a substantial current flow can only be established when the threshold voltage for the current switch has been exceeded, above which current increases without a corresponding increase in voltage. The term "non-resistive voltage drop" is often used to refer to this lack of correspondence between current and voltage in a device. Both the input sensor and the load sensor are configured so that the cumulative threshold voltage provided by the input sensor exceeds the cumulative threshold voltage provided by the load sensor. In simple embodiments of the contactor monitor, the input sensor and the load sensor can be designed such that the difference in cumulative thresholds is configured roughly equal to the maximum voltage drop allowed across the contactor under the rated current.

The input sensor and load sensor form a substantially parallel circuit wherein the input sensor, with voltage threshold $V_{InputThresh}$, is connected in parallel with the load sensor, with voltage threshold $V_{LoadThresh}$, which is in series with the contactor voltage drop, $V_{contactor}$. The maximum allowed voltage drop of the contactor under rated current is given by $V_{contactor-MAX}$. A contactor under normal operation can pass current, up to its rated maximum, with contactor voltage drop given by:

$$V_{contactor} < V_{contactor-MAX} \quad (1)$$

and therefore, $$V_{InputThresh} > V_{LoadThresh} + V_{contactor} \quad (2)$$

The cumulative voltage threshold of the Input sensor is thus greater than the voltage threshold of the load sensor plus the drop across the contactor. Therefore the load sensor will conduct current before the input sensor, and since the voltage is largely independent of the current passing through it, the input sensor would remain in a state of low conduction.

If the contactor is open circuited, or abnormally contaminated, the contactor voltage drop is given by:

$$V_{contactor} > V_{contactor-MAX} \quad (3)$$

and therefore, $$V_{LoadThresh} + V_{contactor} > V_{InputThresh} \quad (4)$$

In the case of a contactor with an unacceptably high resistance, the associated voltage drop at rated current is above the allowed voltage drop for the contactor. This contactor voltage drop, when added to the cumulative voltage threshold within the load sensor, is greater than the conduction threshold of the input sensor. Therefore the input sensor circuit conducts the majority of the overall sense current.

The input and load sensors are connected to a threshold sense circuit that determines the relative current flows and generates a signal in response to the voltage drop across the contactor.

An object of the invention is to provide a method by which the contactor can be continuously monitored.

Another object of the invention is to provide a monitoring device that can withstand the circuit transients that exist within a high current charging system.

Another object of the invention is to provide a monitoring circuit that can be inexpensively implemented with existing electronic devices.

Another object of the invention is to provide a monitoring circuit that may be implemented to suit a number of different contactor situations.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 1 through FIG. 5. It will be appreciated that the apparatus may vary as to configuration and as to details of the parts without departing from the basic concepts as disclosed herein.

Figure 1:
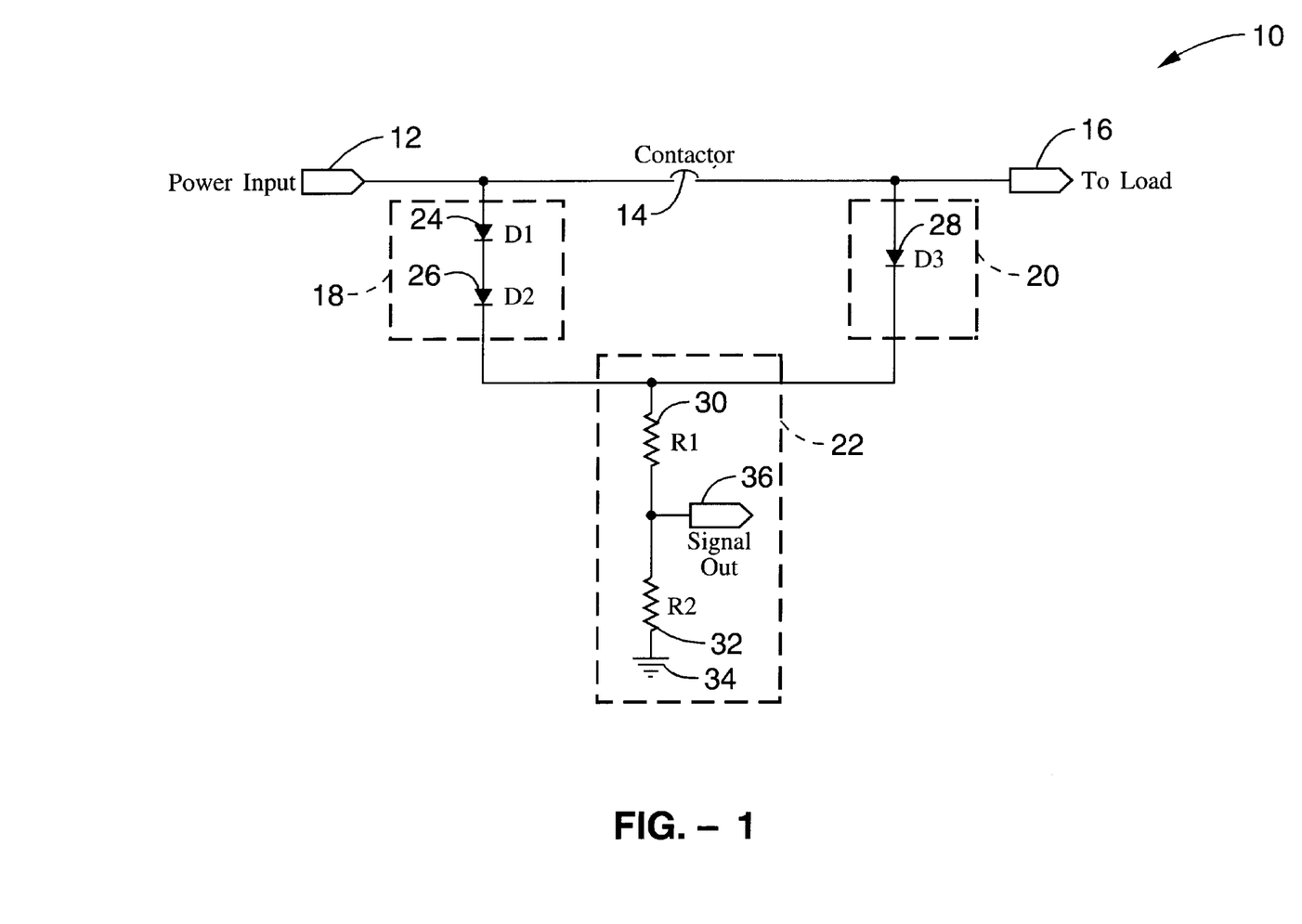
FIG. 1 is a schematic diagram of a basic circuit embodiment for the contactor monitor of the present invention.

A basic circuit for the contactor monitor 10 is generally shown in FIG. 1. A power input 12 provides the charging current conducted through the contactor 14 to the load 16. The circuit architecture comprises three main sections: the input sensor 18, the load sensor 20, and the sense threshold circuit 22. The input sensor 18 within the basic embodiment contains two diodes 24, 26 oriented to allow current to flow to the sense threshold circuit 22. The load sensor 20 is shown with diode 28 oriented to conduct current to the sense threshold circuit 22.

The sense threshold circuit 22 in this basic embodiment contains a resistive divider formed by resistors 30, 32 connected to a common ground 34 for the circuit, with a center tap on the resistive ladder providing an output signal 36.

When the contactor of the circuit is open circuited no charging current flows, yet current flows through the input sensor 18 to the sense threshold circuit 22. A voltage drop is created across the input sensor which comprises two diodes 24, 26, whose cumulative voltage drop is approximately 1.2 volts. When the contactor is closed, a voltage across the contactor and the load sensor 20 is established. The load sensor with its single diode voltage drop becomes biased into conduction whenever the contactor voltage drop is below 0.6V, while the larger cumulative threshold voltage for the input sensor 18 is no longer biased for conduction and current through the input sensor 18 decreases. Therefore as the contactor closed, the voltage on the output signal 36 changes by an amount proportional to one diode voltage drop minus the voltage drop across the contactor. The output signal provides a monitor for the conduction state of the contactor.

Until the contactor voltage drop equals or exceeds the voltage drop of one diode, it is apparent that as contactor voltage drop increases, a proportional voltage decrease occurs on the output signal. When the contactor voltage drop equals or exceeds one diode voltage drop, the load sensor will already be biased off and no further changes in the voltage of the output signal will occur.

It will be noted at this point that all of the preferred embodiments disclosed employ negatively grounded circuits; however, those skilled in the art will readily appreciate that the embodiments can operate equally well on positively grounded systems if obvious circuit changes are made, such as reversing the orientation of polarity sensitive components.

Figure 2:
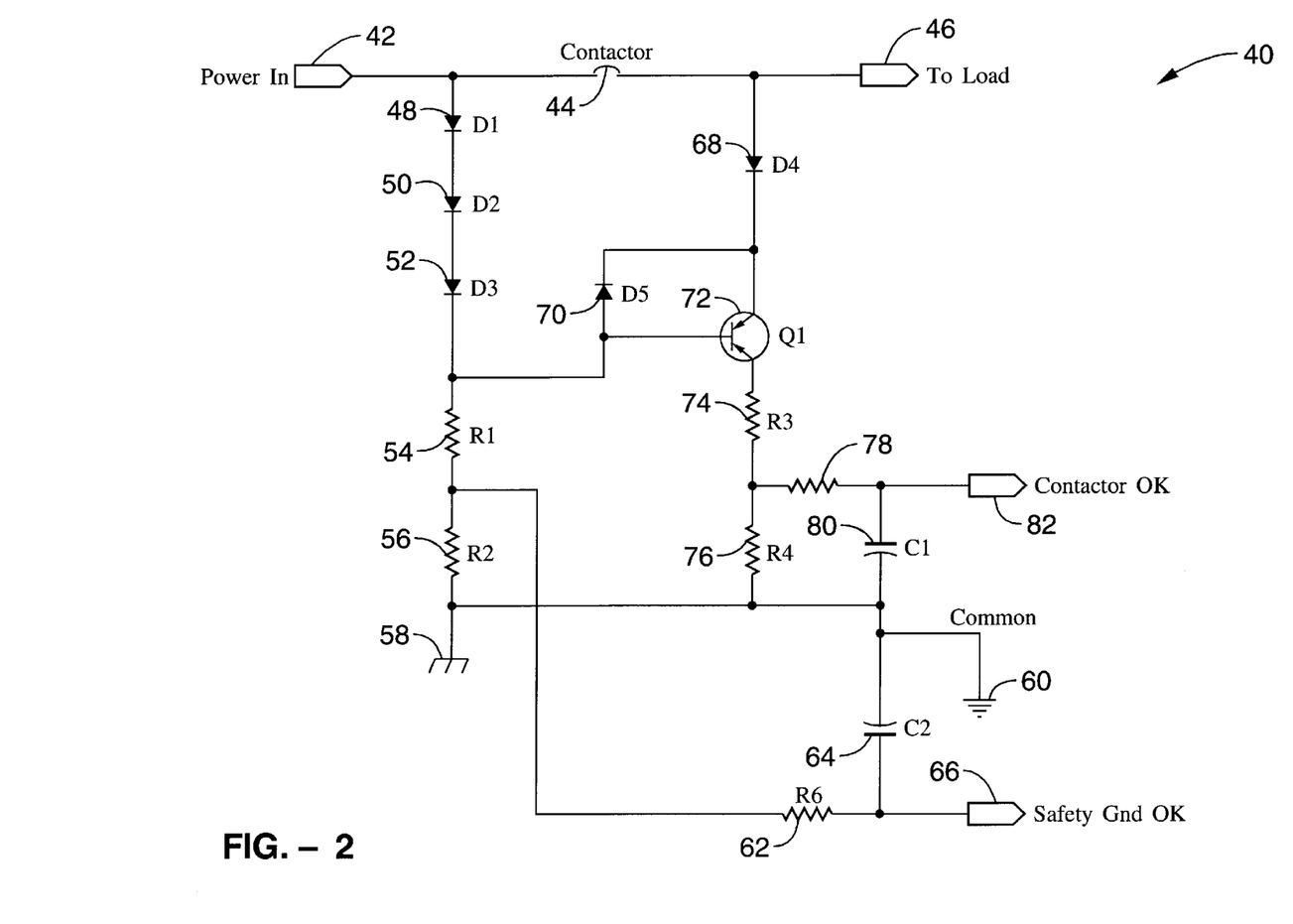
FIG. 2 is a schematic diagram of an alternative embodiment of a contactor monitor according to the present invention which incorporates a safety ground check.

FIG. 2 shows another embodiment of the contactor monitor 40, which provides a binary ON/OFF signal and an added circuit which monitors conduction to a safety ground. Current flows from an AC or DC power input 42 through the contactor 44, to the load 46. With the contactor 44 open, current flows through the three diodes 48, 50, 52 and through the resistors 54, 56 to a safety ground 58. The safety ground 58 connects with common ground 60 which is tied to the safety ground 58. Current flow to safety ground 58 creates a voltage across the resistor 56 which is current limited and filtered by resistor 62 and capacitor 64 and which is output as the Safety Ground OK signal 66. With the contactor open, no current flows through the diodes 68, 70 on the load side of the contactor 44. Transistor 72 is biased off with its base voltage higher than its emitter voltage. A diode 70 across the base-emitter junction of transistor 72 limits the reverse voltage across the junction. As a result of reverse biasing, transistor 72 remains off with no appreciable current flowing through resistors 74, 76, and the Contactor OK signal 82 remains at ground potential.

In the circuits of the present invention a contactor in normal operation (up to the rated current) exhibits a voltage drop considerably less than the 0.6 volt maximum contactor voltage drop. A contactor exhibiting a drop above this maximum value is considered inoperable. In the circuit of FIG. 2 when the contactor 44 is closed, current flows to the load 46. It can be seen that the base of the transistor 72 is subject to a voltage which is three diode drops below the power input 42 voltage, whereas the voltage at the emitter is subject to one diode drop plus contactor voltage below the input voltage 46. Therefore the transistor 72 is biased with a voltage roughly equivalent to two diode drops less the minimal contactor voltage drop. With transistor 72 in a conduction mode, current flows through diode 68, through the transistor 72, and through the resistor divider comprising resistors 74, 76, to the common ground 60. The voltage signal on the resistor 76 is limited and filtered by resistor 78 and capacitor 80 and output as the Contactor OK signal 82. Unlike the circuit of FIG. 1, current through the input sensor diodes 48, 50, 52 continues to flow through the resistor divider 54, 56 to hold the Safety Ground OK signal 58 above ground. Within these embodiments the threshold sense circuit is responsive to the difference in current flows between the input sensor circuits and the load sensor circuits.

Still referring to FIG. 2, if the contactor 44 is contaminated such that the voltage drop across the contactor exceeds 0.6 volts, the transistor 72 ceases to conduct. As the transistor 72 turns off, the voltage at the Contactor OK signal 82 returns to ground potential. The transistor 72 ceases conduction because its emitter-to-base voltage is no longer sufficiently biased above 0.6 volts due to the increases voltage drop across the contactor 44.

If no current can be conducted through the safety ground 58 then no current can flow from either the power input 42 or the load 46 side of the contactor 44. With no current flowing, no voltage potential is impressed across either the Contactor OK signal 82 or the Safety OK signal 66.

It should be understood that the PNP transistor 72 of this preferred embodiment shown in FIG. 2 could be replaced by one or more alternate switching elements. Anyone skilled in the art should recognize that the transistor can be replaced by other forms of transistors, such as: NPN transistors, FETS, TRIACS, SCRs, Darlington-transistors, and integrated switching elements. In addition, the switching element can be replaced with a relay. Substitution of devices requires circuit modifications obvious to one skilled in the art.

The circuit of FIG. 2 described above has been shown to provide a pair of signals for monitoring the condition of the contactor. The Safety ground OK signal 66 is above ground potential (at a logic high state) as long as the Safety ground of the system is tied to the power supply ground and thereby providing a return path. The Contactor OK signal 82 is above ground potential (at a logic high level) when the contactor is in the closed position and when the voltage across the contactor is below the voltage equivalent of a single diode.

Figure 3:
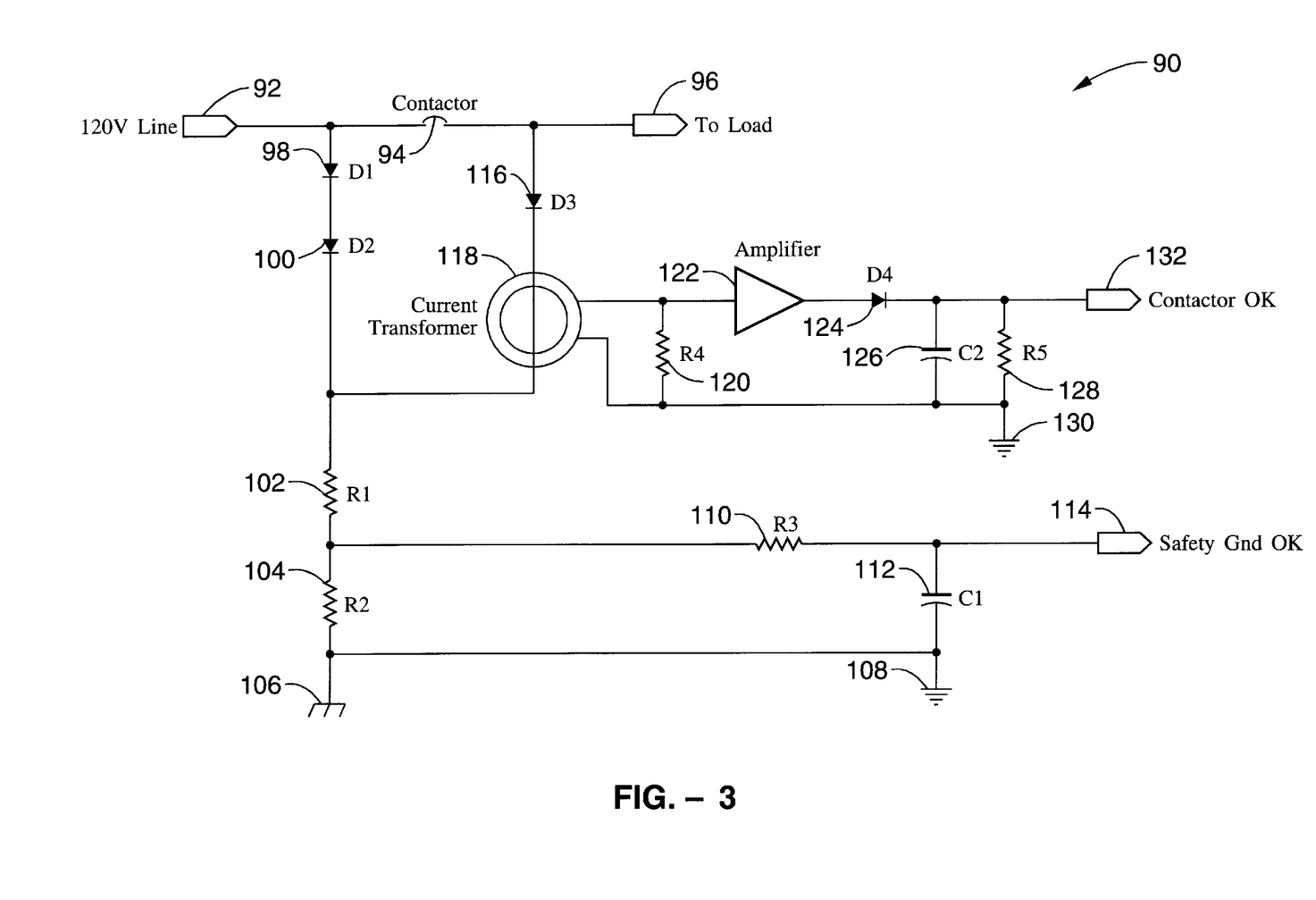
FIG. 3 is a schematic diagram of an alternative embodiment of a contactor monitor according to the present invention which employs a current transformer for current sensing.

FIG. 3 shows another embodiment of the contactor monitor 90 which employs a non-contact magnetic current sensor which senses current by sensing magnetic flux. The embodiment 90 employs a current transformer 118 that senses the amplitude of AC current by the induced EMF in the transformer coil. AC charging current flows from a power input 92 through contactor 94, to the load 96. If the contactor 94 is open circuited, then current flows through the diode pair 98, 100 and through resistors 102, 104 to the safety ground 106. The safety ground 106 is connected to the common ground 108 which is the ground reference for the circuitry. The Safety Ground OK signal 114 is derived from the voltage across a resistor 104 which is current limited and filtered by resistor 110 and capacitor 112. The Safety Ground OK signal 114 is maintained above ground potential so long as the power input is switched on and safety ground is connected to the ground of the power supply.

With contactor 94 open circuited, current flows through the diode pair 98, 100, yet no current flows through the load side sense diode 116 and thereby no voltage is generated within the current transformer 118.

With contactor 94 closed, current flows from the power input 92 through the contactor to the load 96. In addition, current can flow through the load side sense diode 116 and resistors 102, 104 to the safety ground 106. If the voltage drop across the contactor is less than the voltage drop across a diode, then current stops flowing through the power input sense diode pair 98,100, since the voltage across the diode pair becomes less than that required for conduction. The current transformer 118 transforms the alternating magnetic flux field into an alternating voltage which is fed into the amplifier circuit 122. The transformer output is referenced to common ground 130 and is loaded by resistor 120. The amplifier 122 amplifies the small AC signal generated by the transformer into a signal amplitude consistent with the signal levels required. The amplified signal is rectified by diode 124 whose output charges capacitor 126 in parallel with load resistor 128, which is output as the Contactor OK signal 132. When the current stops flowing through the load sensor diode 116, the amplifier signal no longer charges the capacitor, and the capacitor discharges through the load resistor 128, whereby the Contactor OK signal 132 returns to ground potential.

Within the embodiment of FIG. 3 the current sensor is configured to sense current passing through the load sensor on the load side of the contactor, yet the current sensor could alternately be used on the input sensor with similar result since only one of the sensor circuits is conducting at any one time. It should be recognized that various forms of non-contact current sensors can be substituted for the current transformer used within the embodiment that is generally depicted in FIG. 2. A wide variety of non-contact sensors exist today that include not only various transformers, but also hall-effect devices and integrated circuits that provide current sense capability. The circuit can be configured by anyone skilled in the art without inventive effort to employ any of these various non-contact current sensors.

Should the contactor be contaminated, whereby a voltage drop exceeding 0.6 volts occurs across the contactor, then the Contactor OK signal 132 drops to a logic low level signal. This drop occurs because the voltage drop across the input sense diodes 98, 100 becomes less than the collective drops of the load sense diode 116 plus the voltage drop across the contactor 94 which biases off the diode 116 thereby stopping current flow through the current transformer which causes a consequent drop in the Contactor OK signal 132.

Figure 4:
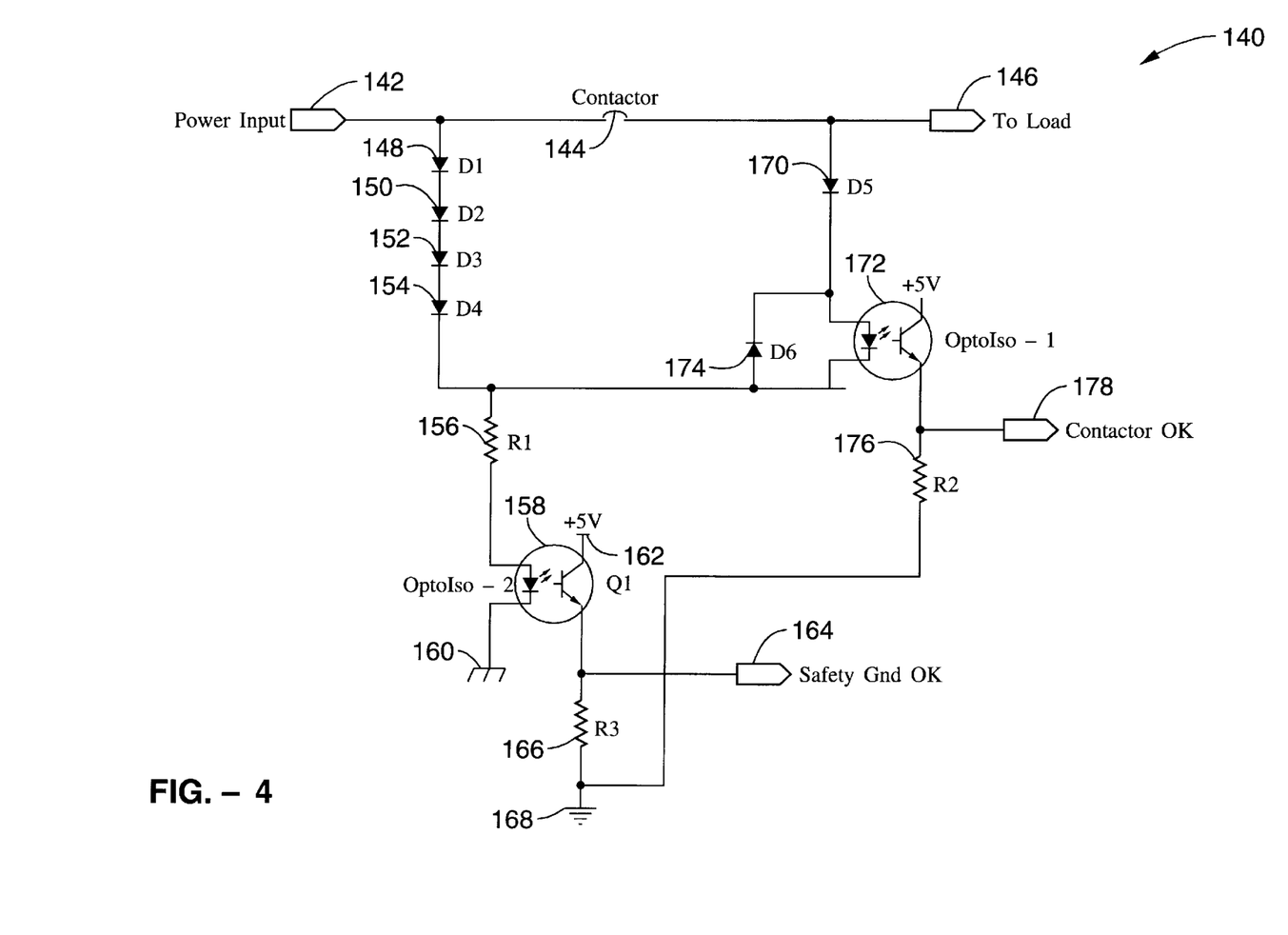
FIG. 4 is a schematic diagram of an alternative embodiment of a contactor monitor according to the present invention which employs opto-isolators for current sensing.

FIG. 4 shows still another embodiment of the contactor monitor 140 which employs isolated current sensing circuits in the form of opto-isolators. In this embodiment of the invention, charging current flows from an AC or DC power input 142 through the contactor 144 to the load 146. If the contactor 144 is open circuited, then input sensor current flows through the four diodes 148, 150, 152, 154, resistor 156, and through the input LED of the opto-isolator 158, to the safety ground 160. The output transistor stage of the opto-isolator 158 is configured as an emitter follower, wherein the collector is pulled up to a logic supply voltage 162, whereas the emitter, which supplies the Signal Ground OK signal 164, is coupled through a resistor 166 to common ground 168. When current is flowing to the safety ground 160, the opto-isolator 158 is turned on and current flows from the logic supply voltage through the emitter resistor 164 on the output side which raises the Safety Ground OK signal from ground potential to a logic high level.

When the contactor 144 is closed, current flows from the power input 142 through the contactor to the load 146. In addition, current begins flowing through the load side sense diode 170, through the input of an opto-isolator 172, which contains a reverse voltage protection diode 174, and through a resistor 176 to ground 168. The Contactor OK signal 178 is provided by the voltage across the emitter resistor 176 and provides a logic level high output. It must be considered that the opto-isolators of the preferred embodiment are but one variety of isolated current sensor. Various devices exist wherein the current along one or more current paths through the device controls the state of an isolated digital (on/off) or analog (linear) switch. Alternative isolated current sensors could be obviously employed within the circuit by anyone skilled in the art.

Should the contactor become contaminated such that the contactor voltage drop rises to exceed 0.6 volts, the Contactor OK signal 178 drops to a low logic level. This transition occurs since the collective voltage drops on the input side diodes 148, 150, 152, 154, become less than the drops associated with the load sensor with diode 170, plus the LED drop within the opto-isolator 172, added to the voltage drop of the contactor 144.

Note that the embodiments depicted in FIG. 1 through FIG. 4 sense a maximum voltage drop across the contactor under rated current of about 0.6 volts which corresponds to the voltage drop across a single silicon p-n junction such as found in a silicon diode or the emitter-base junction of a transistor. The voltage drops are generally provided for in these embodiments using diodes. Additional diodes can be added to the these embodiments to allow the maximum contactor drop threshold to be increased to 1.2, 1.8, 2.4 volts, and so on, by the addition of more input sensor diodes. Alternately, the type of diode may be changed in order to alter collective voltage drops in the input and load sense circuits. For example one of the silicon diodes (0.6V drop) within the input sensor circuit on any of the circuits shown in FIG. 1 through FIG. 4 could be replaced with a germanium diode (0.3V drop) wherein the circuit would then exhibit a contactor voltage drop threshold of 0.3 volts instead of the previous 0.6 volts. Other forms of semiconductor devices can be substituted to provide various amounts of voltage drop so that the simple circuit embodiments shown can be configured to sense a variety of contactor voltage drop thresholds.

Figure 5:
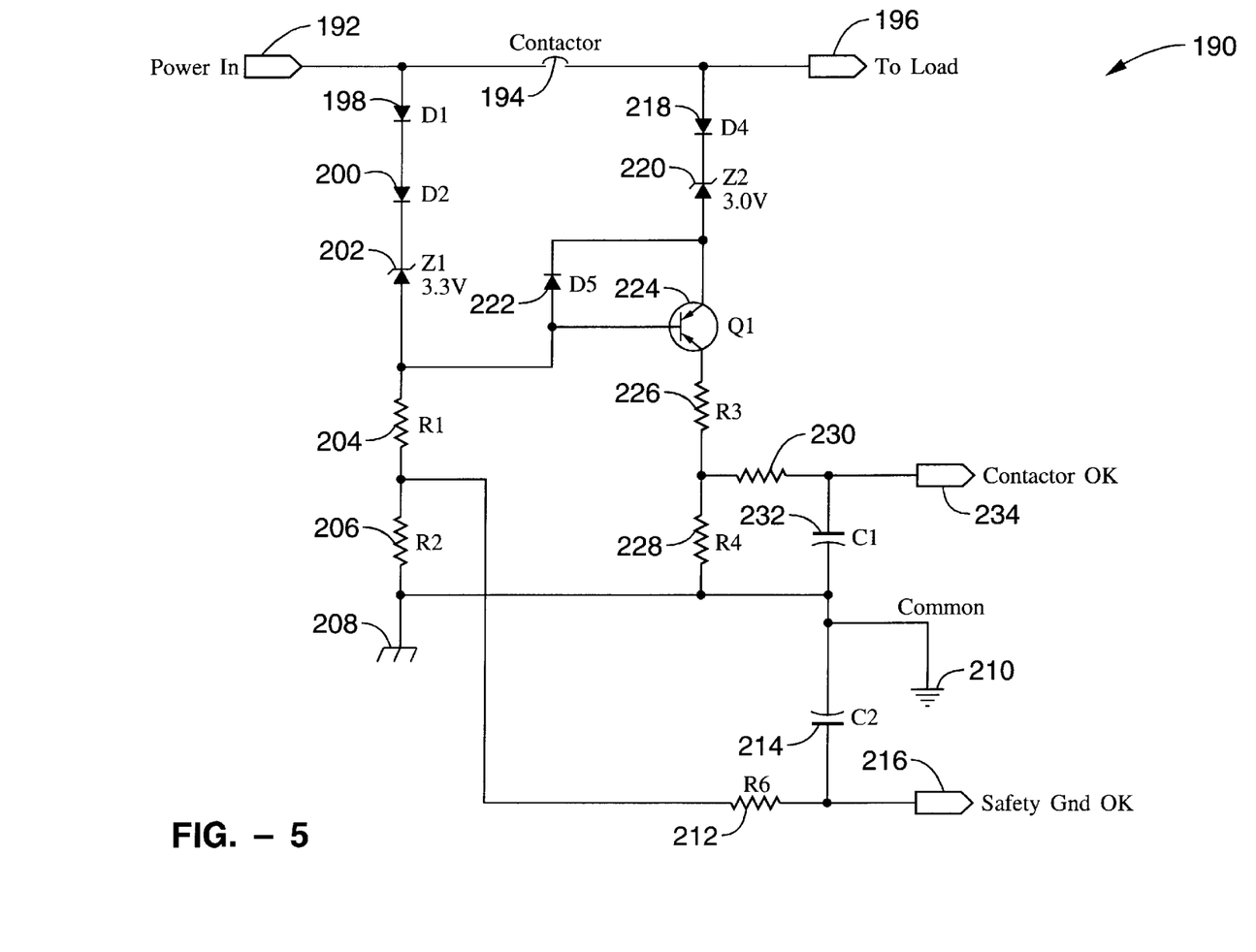
FIG. 5 is a schematic diagram of an alternative embodiment of a contactor monitor according to the present invention which employs Zener diodes.

Referring now to FIG. 5, an embodiment of the contactor monitor 190 is shown that incorporates a Zener diode 202 with a 3.3V reverse threshold into the input sensor circuit, and a Zener diode 220 with a 3.0V reverse threshold into the load sensor circuit, to set the contactor voltage drop threshold of the monitor circuit. FIG. 5 was adapted from FIG.2, and depicts just one means of incorporating the Zener diodes. Adding up the voltage drops in the circuit of FIG. 5, the input sense circuit has a collective voltage drop (threshold) of 4.7V (3.3V+0.6V+0.6V) whereas the load sense circuit has a collective drop (threshold) of 4.4V (3.0V+0.6V+0.6V). Therefore in FIG. 5 the monitor circuit is responsive to a contactor voltage drop of 0.3V and the Contactor OK signal 234 will drop to ground potential when the voltage drop across the contactor exceeds 0.3V. Zener diodes can be obtained in a wide range of reverse voltages which allow the threshold voltage for the Contactor OK signal to be set to virtually any relative voltage.

The five alternative embodiments described herein provide circuits wherein the voltage drops inherent with semiconductor devices are used differentially to sense the voltage drop across a contactor. It should however be appreciated that the invention can be implemented with a variety of alternate circuits while retaining the inventive principles outlined. Accordingly, it will be seen that this invention can be implemented with a variety of diodes, or other semiconductor elements in which a non-resistive voltage drops are exhibited. FIG. 2 described the use of a PNP transistor in one of the sensor circuits. The PNP transistor can be replaced by a variety of semiconductor devices that exhibit similar voltage drop characteristics, wherein conduction would cease across the device as the applied voltage drops. FIG. 3 and FIG. 4 represent two embodiments employing alternative current sense elements with the same inventive principle. A large number of sensing elements can be employed to sense changes in the relative current flow between the input sensor circuit and the load sensor circuit that occur as a result of changes in the contactor voltage drop.

Therefore, it can be seen that the present invention provides for monitoring the voltage drop across the contacts of a contactor or other switching device to determine if the resistance of the conduction path has increased to an unacceptable level. While the present invention is described in the context of charging circuitry for electric vehicles, those skilled in the art will appreciate that the invention can be used with any contactor or switching device.

Although the description contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. An apparatus for monitoring a voltage drop across a contactor which has both a power input and a power output, wherein the monitoring circuit comprises:

(a) an input sense circuit connected to said power input of said contactor, across which a voltage of at least X volts must be applied before substantial current flows;

(b) an output sense circuit connected to said power output of said contactor, across which a voltage of at least Y volts must be applied before substantial current flows, wherein voltage X is greater than voltage Y; and (c) a sense threshold circuit which generates an electrical signal responsive to the voltage drop across said contactor, wherein said sense threshold circuit is connected to at least one of said sense circuits such that the contactor voltage drop is determined by the difference in current being conducted through said input sense circuit and said output sense circuit.

2. An apparatus as recited in claim 1, wherein the sense threshold circuit additionally generates an electrical signal indicating that a power return path for the power input is capable of conducting current from said power input, wherein said electrical signal is generated in response to current flowing through said input sense circuit.

3. An apparatus as recited in claim 1, wherein said input sense circuit and said output sense circuit employ semiconductor circuit elements through which the flow of significant current requires a bias voltage in excess of a threshold voltage.

4. An apparatus as recited in claim 1, wherein significant current flows through the output sense circuit only when the voltage drop across said contactor is below a predefined threshold level, and wherein the threshold sense circuit provides a signal responsive to the difference in current between the input sense circuit and the output sense circuit.

5. An apparatus as recited in claim 1, wherein the input sense circuit comprises at least two semiconductors that are connected so that their voltage drops are in series.

6. An apparatus as recited in claim 1, wherein the sense threshold circuit comprises a resistor divider to limit the maximum output voltage of the generated electrical signal.

7. An apparatus as recited in claim 1, wherein an electronic switching element in the load sense circuit regulates current flow therethrough in response to a voltage drop within the input sense circuit, wherein said electronic switching element allows a control signal to regulate conduction within another circuit path within the switching element, and wherein said electronic switching element is selected from the group of electronic switching elements consisting of transistors, field-effect transistors, SCRs, TRIACs, Darlington-transistors, relays, and integrated switching circuits.

8. An apparatus as recited in claim 7, wherein said electronic switching element comprises a transistor.

9. An apparatus as recited in claim 1, wherein a magnetic sensor is used within the sense threshold circuit to sense the amplitude of the current flow in at least one of the sense circuits, and wherein said magnetic sensor provides an output signal in relation to sensed magnetic flux.

10. An apparatus as recited in claim 9, wherein said magnetic sensor comprises a current transformer.

11. An apparatus as recited in claim 1, wherein an isolated current sensor is used within the sense threshold circuit to sense the amplitude of the current flow in at least one of the sense circuits, wherein said isolated current sensor provides an output signal path is electrically isolated from an input signal path, and wherein said output signal path is conductively responsive to the current passing through said input signal path.

12. An apparatus as recited in claim 11, wherein said isolated current sensor comprises an opto-isolator.

13. A battery charging apparatus, comprising:
(a) a contactor with a power input and a power output, wherein upon application of a charging voltage, the contactor is capable of conducting current between said power input and said power output, said contactor being capable of at least two conduction states;
(b) an input sense circuit connected to said power input of said contactor, through which a significant current W begins flowing as the voltage across the input sense circuit rises above a predetermined threshold voltage X;
(c) an output sense circuit connected to said power output of said contactor through which a significant current W begins flowing as the voltage across the output sense circuit rises above a predetermined threshold voltage Y, wherein X is greater than Y; and
(d) a sense threshold circuit connected to both the input sense circuit, and the output sense circuit, and to a power return path for said charging voltage, wherein the sense threshold circuit generates an electrical signal in relation to the voltage drop across said contactor which is determined by the difference in current being conducted through said input sense circuit and said output sense circuit.

14. A method of monitoring the voltage drop across a contactor which has both a power input and a power output, comprising the steps of:
(a) allowing current to flow through an input sense circuit exhibiting a non-resistive voltage drop X;
(b) allowing current to flow through an output sense circuit when the voltage drop across said contactor is below a predetermined threshold, wherein a non-resistive voltage drop Y is produced within said output circuit, wherein X is greater than Y; and
(c) sensing the relative current flows between the input and output sense circuits within a sense threshold circuit which provides an output signal as a function of the relative current flows.

15. A method as recited in claim 14, further comprising the step of using the output signal generated by the sense threshold circuit for monitoring voltage drop across the contactor.

16. An apparatus for monitoring a voltage drop across a contactor of the type having an input and an output, comprising:
(a) an input sense circuit across which a voltage of at least X volts must be applied before substantial current flows;
(b) an output sense circuit across which a voltage of at least Y volts must be applied before substantial current flows, wherein voltage X is greater than voltage Y; and
(c) a sense threshold circuit connected to at least one of said sense circuits, wherein said sense threshold circuit generates an electrical signal responsive to a differential in current conducted through said input sense circuit and said output sense circuit.

17. An apparatus for monitoring excessive resistance in a contactor having input and output contacts, comprising:
(a) means for sensing a voltage drop across said input and output contacts; and
(b) means for generating an output signal responsive to said voltage drop.

18. An apparatus as recited in claim 17, wherein said means for sensing a voltage drop across said input and output contacts comprises:
(a) an input sense circuit across which a voltage of at least X volts must be applied before substantial current flows; and
(b) an output sense circuit across which a voltage of at least Y volts must be applied before substantial current flows, wherein voltage X is greater than voltage Y.

19. An apparatus as recited in claim 18, wherein said means for generating an output signal comprises a sense threshold circuit connected to at least one of said sense circuits, wherein said sense threshold circuit generates an electrical signal responsive to a differential in current conducted through said input sense circuit and said output sense circuit.

* * * * *